United States Patent [19]

Matsuda et al.

[11] Patent Number: 4,888,392
[45] Date of Patent: Dec. 19, 1989

[54] COPOLYMER OF SULFUR DIOXIDE AND POLYALKYLPOLYSILYLSTYRENE

[75] Inventors: Minoru Matsuda, Izumishi; Seiki Itoh; Hiroshi Ono, both of Yokohamashi, all of Japan

[73] Assignee: Chisso Corporation, Osaka, Japan

[21] Appl. No.: 223,115

[22] Filed: Jul. 22, 1988

[30] Foreign Application Priority Data

Nov. 16, 1987 [JP] Japan .................................. 62-289133

[51] Int. Cl.$^4$ .............................................. C08F 30/08
[52] U.S. Cl. .................................... 526/279; 525/536; 528/24; 528/32; 528/385
[58] Field of Search .................... 525/536; 528/24, 32, 528/385; 526/279

[56] References Cited

U.S. PATENT DOCUMENTS

| | | | |
|---|---|---|---|
| 2,833,801 | 5/1958 | Holbrook | 528/32 |
| 3,272,282 | 9/1966 | Lang | 525/536 |
| 3,336,273 | 8/1967 | Youngman et al. | 525/536 |

Primary Examiner—Melvyn I. Marquis

Attorney, Agent, or Firm—Fred Philpitt

[57] ABSTRACT

A copolymer of sulfur dioxide and polyalkylpolysilylstyrene composed of repeating units of formula I:

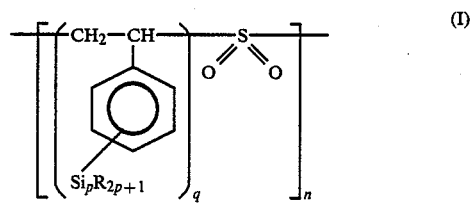

where R is a lower alkyl group, p is an integer between 2 and 5, q in an integer between 1 and 10 representing the sequence length of polyalkylpolysilylstyrene, and n is a number between 5 and 10,000, and having a number-average molecular weight of 2,000 to 2,000,000. This copolymer is a novel and useful positive resist material which is highly sensitive to light, or electron-beam or X-ray radiation and is of high dry etching resistance.

7 Claims, 2 Drawing Sheets

COPOLYMER OF SULFUR DIOXIDE AND POLYALKYLPOLYSILYLSTYRENE

BACKGROUND OF THE INVENTION

1. Field of the Invention

This invention relates to a copolymer which is particularly useful for making a positive resist.

2. Description of the Prior Art

The recent improvement of lithography, as well as processing techniques, is so remarkable that photolithography is making possible the resolution of images which are so close to each other as they have a distance of only 0.5 micron therebetween. Electron-beam lithography is used for making various kinds of custom devices, as it can do a finer or more precise work than photolithography, though it has a lower throughput.

Poly(butene-1 sulfone)(PBS) has a high sensitivity to electron-beam radiation and is widely used as a positive resist for making photomasks. Its scope of uses is, however, limited by its low dry etching resistance.

A multylayer resist process has recently been drawing attention as being applicable to fine lithography. Various attempts have been made to obtain polymers having oxygen-reactive ionic etching (RIE) resistance. Silicon-containing resists for photo and electron-beam patterning have been developed as one of the products of those attempts. Most of these resists are, however, negative, and only a few of them are positive resists having oxygen-reactive ionic etching (RIE) resistance.

Examples of the few positive resist materials are poly(3-butenyltrimethylsilane sulfone) as disclosed at the 7th International Conference on Photopolymers, New York, 1985, and poly(trimethylsilylstyrene sulfone) (PTMSS) as disclosed in Japanese Patent Application Laid-Open No. 215628/1987. Neither of these two kinds of polymers is, however, satisfactory. The former is low in heat resistance and is not satisfactory in oxygen-RIE resistance, either. The latter is not satisfactory in oxygen-RIE resistance, either, though its heat resistance is excellent.

SUMMARY OF THE INVENTION

Under these circumstances, it is an object of this invention to provide a polymer for a positive photo or electron-beam resist which is excellent both in heat resistance and in oxygen-RIE resistance.

This object is attained by a copolymer of sulfur dioxide and polyalkylpolysilylstyrene which comprises a linear compound composed of 1 to 50 mol % of structural units of the formula:

and 50 to 99 mol % of structural units of the formula:

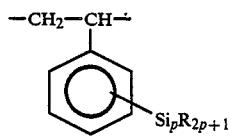

ps where R is a lower alkyl group, and p is an integer between 2 and 5, and having a number-average molecular weight of 2,000 to 2,000,000.

The copolymer of this invention is superior to the known PTMSS in oxygen-RIE resistance. Moreover, it is highly sensitive to light having a wavelength of 220 to 300 nm.

Other features and advantages of this invention will be apparent from the following description and the accompanying drawings.

DETAILED DESCRIPTION OF THE INVENTION

The copolymer of sulfur dioxide and polyalkylpolysilylstyrene according to this invention is represented by formula I:

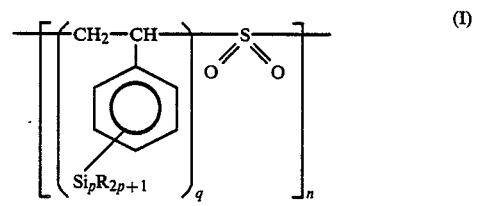

where R stands for $CH_3$ or $C_2H_5$, p is an integer between 2 and 5, q is an integer between 1 and 10 representing the sequence length of a molecule of the polyalkylpolysilylstyrene which distribute in one molecule in optional numeral value, and n is an integer between 5 and 10,000 representing the number of repeating units.

Each structural unit of polyalkylpolysilylstyrene contains a polyalkylpolysilyl group substituted on the m-or p-position of the aromatic ring of styrene. The polyalkylpolysilyl group may, for example, be one of linear or branched polysilanes of the formulas:

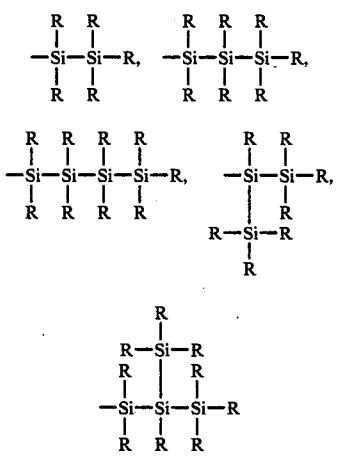

or a mixture of linear and branched polysilanes.

When the copolymer of this invention is used for a resist, it has a higher sensitivity to light or electronbeam radiation as the value of q in formula I approaches one. On the other hand, it has a higher plasma resistance and particularly a higher oxygen-RIE resistance with an increase in silicon chain length. Moreover, it is particularly worthy of notice that the copolymer has an UV absorption wavelength $\lambda_{max}$ shifted to a longer wavelength if its silicon chain length is increased. According to this invention, therefore, it is possible to obtain a copolymer which can absorb any light having a wavelength of 220 to 300 nm, if its silicon chain length is appropriately selected.

The invention will now be described more specifically with reference to a number of examples thereof.

EXAMPLE 1

A polymerizing tube of pressure-resistant glass having a capacity of 100 ml was charged with 144 mg of tertbutyl hydroperoxide and 15.1 g of newly distilled p-pentamethyldisilylstyrene. After oxygen had been removed from the tube by repeated evacuation, it was charged with 20.2 g of sulfur dioxide having a temperature of $-10°$ C. which had been dehydrated with $P_2O_5$ and dried, and the contents of the tube were carefully mixed. The tube was placed in a vessel having a temperature of $-50°$ C. and the contents thereof were left for polymerization for 24 hours. Then, the tube was opened, and after the unreacted $SO_2$ had been removed by bubbled $N_2$, the remaining liquid was poured from the tube into methanol under stirring, whereby a white powder was obtained. This powder, or polymer was collected on a glass filter. Then, it was dissolved in a small amount of acetone and its solution was poured into methanol for refining by sedimentation. The refined product was allowed to dry at an ordinary room temperature in a vacuum for 48 hours to yield 4.4 g of polymer.

Figure 1:
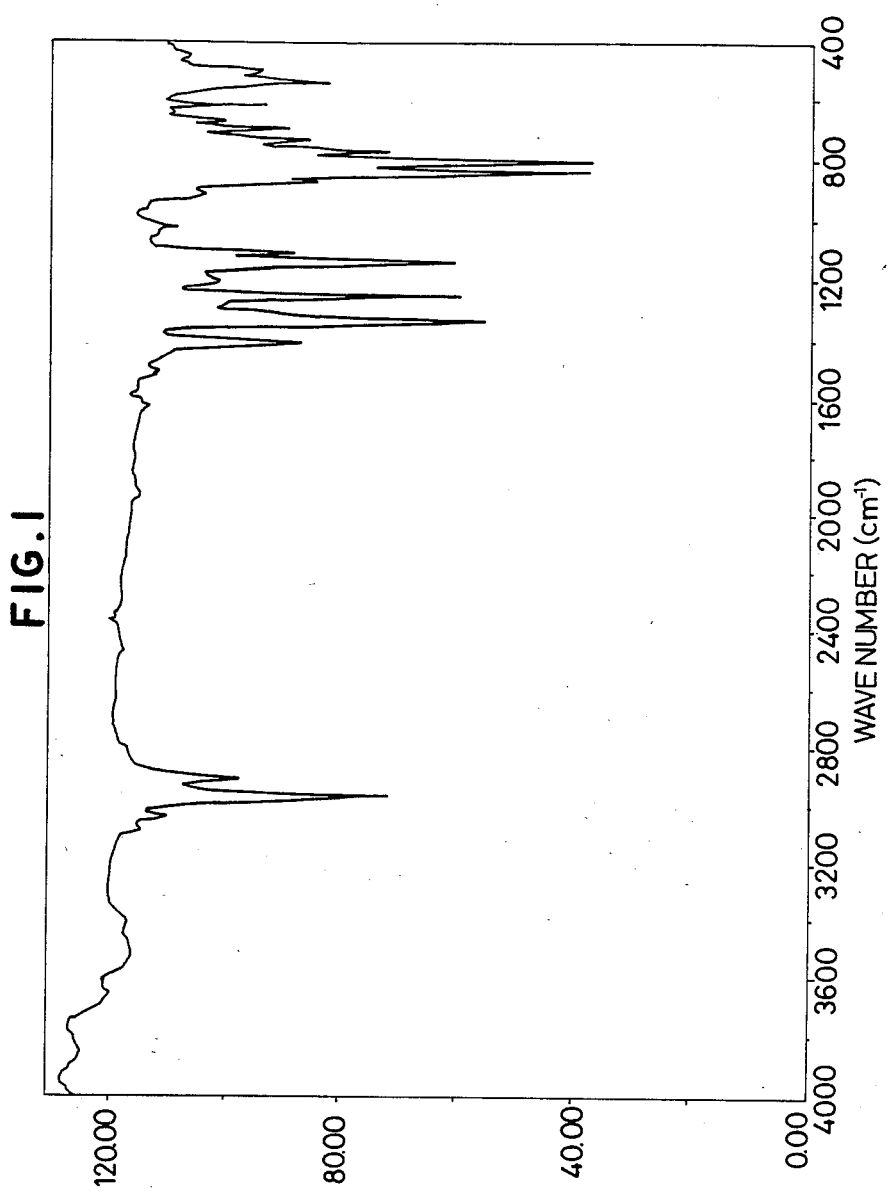
FIG. 1 is a diagram showing the IR absorption spectrum of the copolymer according to EXAMPLE 1 of this invention which will hereinafter be described.

The IR absorption spectrum of the polymer is shown in FIG. 1. The elemental analysis of the polymer revealed that it contained 52.83% C and 7.52% H, while calculation had indicated that it, as an alternating copolymer having an alternating ratio of 1:1, would contain 52.29% C and 7.44% H. As is obvious from FIG. 1 and the results of its elemental analysis, the polymer which had been obtained was a copolymer of sulfur dioxide and pentamethyldisilylstyrene. It was an alternating copolymer composed of the pentamethyldisilylstyrene and sulfone units having an alternating ratio of 1:1, as shown by the following formula:

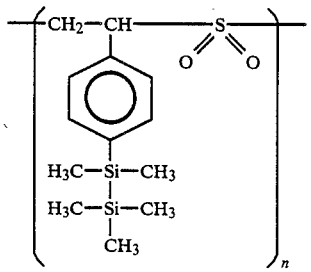

The analysis of the polymer by gel permeation chromatography revealed that it had a number-average molecular weight ($\overline{M}_n$) of 349,000 and a molecular weight distribution ratio $\overline{M}_w/\overline{M}_n$ of 2.7, in terms of polystyrene. Its thermal analysis showed that it had a glass transition temperature (Tg) of 164° C and a decomposition temperature ($T_d$) of 190° C.

Figure 2:
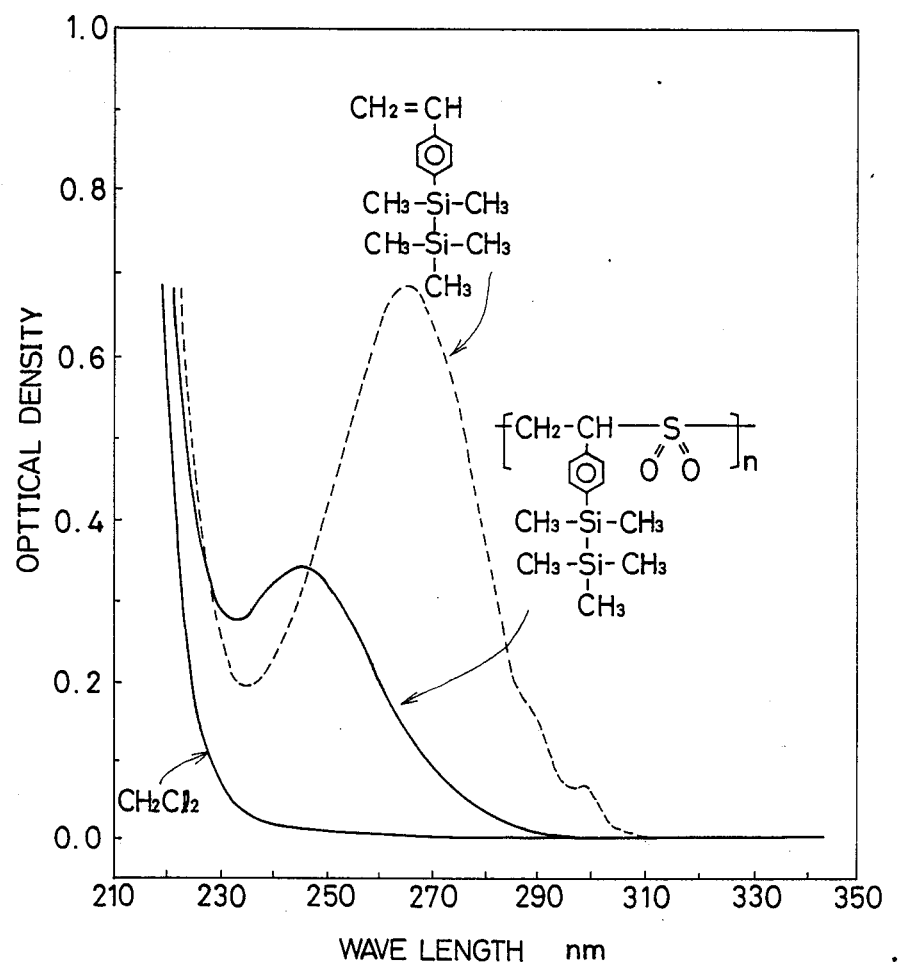
FIG. 2 a diagram showing the UV absorption spectrum thereof.

FIG. 2 shows the UV absorption spectrum of the polymer which was obtained by dissolving it in dichloromethane. It showed a "maximum" absorption wavelength $\lambda_{max}$ of 246 nm and a molar absorption coefficient of 10,800. FIG. 2 also shows the UV absorption spectrum of the pentamethyldisilylstyrene "monomer".

TEST 1

The polymer (as purified) which had been obtained in EXAMPLE 1 was dissolved in cyclohexanone to prepare a solution having a polymer content of 5.0% by weight. The solution was passed through a Teflon filter having a mesh size of 0.2 micron. It was applied onto a silicon wafer by spin coating at a rotating speed of 2,000 rpm. The coated wafer was prebaked in an oven at a temperature of 150° C. for an hour, whereby a prebaked film having a thickness of 0.5 micron. The film was irradiated with an electron beam at an accelerated voltage of 20 kV by an electron-beam exposure apparatus (Model ERE-301 of ELIONIX). It showed a resolution sensitivity of $3 \times 10^{-6}$ C/cm$^2$.

By the way, the development of it or film was carried out by dipping the film in a mixed solvent consisting of metyl isobutyl ketone and isopropanol in a volume ratio of 38:62 at an ordinary room temperature for three minutes, and rinsing it in isopropanol for one minute. The thickness of the film was measured by a mechanical stylus surface profiler.

TEST 2

The procedures of TEST 1 were repeated for preparing a prebaked polymer film having a thickness of 0.5 micron. The film was exposed to deep UV light by employing an Ushio 500 W Xe-Hg lamp as a light source, a Canon PLA-520 illuminating system and a CM 250 cold miller. It showed a decomposition sensitivity of 30 mJ/cm2. It produced a trapezoidal pattern of images with a resolution of 0.5 micron, which was the highest degree of resolution possible by the mask employed. By the way, the development of the film was carried out by dipping the film in a mixed solvent consisting of methyl isobutyl ketone and isopropanol in a volume ratio of 30:70 at an ordinary room temperature for five minutes, and rinsing it in isopropanol for one minute.

EXAMPLE 2

A polymerizing tube of pressure-resistant glass having a capacity of 100 ml was charged with 150 mg of tertbutyl hydroperoxide and 23.4 g of newly distilled p-heptamethyltrisilylstyrene. After oxygen had been removed from the tube by repeated evacuation employing liquid nitrogen, it was charged with 24.6 g of sulfur dioxide having a temperature of $-10°$ C. which had been dehydrated with $P_2O_5$ and dried, and the contents of the tube were carefully mixed. The tube was placed in a vessel having a temperature of $-50°$ C and the contents thereof were left to stand for polymerization for 15 hours. Then, the tube was opened and after the unreacted $SO_2$ had been removed by bubbled nitrogen gas, the remaining liquid was poured from the tube into methanol under stirring, whereby a white powder was obtained. This powder, or polymer was collected on a glass filter. It was dissolved in a small amount of acetone and its solution was poured into methanol for refining by sedimentation. The resulting powder was allowed to dry at an ordinary room temperature in a vacuum for 48 hours to yield 6.0 g of polymer.

The elemental analysis of the polymer revealed that it contained 50.32% C and 7.81% H. These values were in good coincidence with the results of calculation which had indicated that it would, as an alternating copolymer having an alternating ratio of 1:1, contain 50.50% C and 7.91% H. Its IR absorption spectrum showed signals due to $SO_2$ at 1350 cm$^{-1}$ and 1130 cm$^{-1}$. As is obvious from these results, the polymer which had been obtained was a copolymer of sulfur dioxide and p-heptamethyltrisilylstyrene, and it was composed of p-heptamethyltrisilylstyrene and sulfone units having an alternating ratio of 1:1, as shown by the following formula:

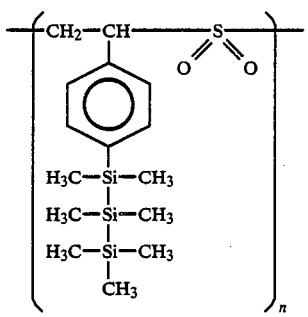

The analysis of the polymer by gel permeation chromatography revealed that it had a number-average molecular weight ($\overline{M}_n$) of 256,000 and a molecular weight distribution ratio ($\overline{M}_w/\overline{M}_n$) of 2.1, in terms of polystyrene. The UV absorption spectrum of the polymer which had been dissolved in dichloromethane showed a maximum absorption wavelength $\lambda_{max}$ of 255 nm and a molar absorption coefficient of 15,000.

What is claimed is:

1. A copolymer of sulfur dioxide and polyalkylpolysilylstyrene comprising a linear compound composed of 1 to 50 mol % of structural units of the formula:

and 50 to 99 mol % of structural units of the formula:

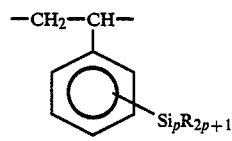

where R is a lower alkyl group and p is an integer between 2 and 5, and having a number-average molecular weight of 2,000 to 2,000,000.

2. A copolymer as set forth in claim 1, wherein each of said units of polyalkylpolysilylstyrene contains a polyalkylpolysilyl group substituted on the m- or p-position in the aromatic ring of styrene, while said R is a group selected from between a methyl and an ethyl group.

3. A copolymer as set forth in claim 2, wherein said polyalkylpolysilyl group is a polysilane which is linear branched or a mixture of linear and branched.

4. A copolymer according to claim 1 where p is 2.

5. A copolymer according to claim 2 claim 2 where p is 2.

6. A copolymer according to claim 1 wherein p is 3.

7. A copolymer according to claim 2 wherein p is 3.

* * * * *